(12) United States Patent
Morishita et al.

(10) Patent No.: US 7,196,379 B2
(45) Date of Patent: Mar. 27, 2007

(54) MOS CAPACITOR DEVICE

(75) Inventors: Tomonari Morishita, Kawasaki (JP); Hideo Nunokawa, Kawasaki (JP); Suguru Tachibana, Kawasaki (JP); Fukuji Kihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/965,856

(22) Filed: Oct. 18, 2004

(65) Prior Publication Data
US 2005/0280084 A1 Dec. 22, 2005

(30) Foreign Application Priority Data
Jun. 16, 2004 (JP) ............... 2004-178532

(51) Int. Cl.
*H01L 29/78* (2006.01)
*H01L 21/8238* (2006.01)

(52) U.S. Cl. ............... 257/357; 257/369; 257/401; 438/199; 438/275

(58) Field of Classification Search ............... 257/357, 257/401
See application file for complete search history.

(56) References Cited

U.S. PATENT DOCUMENTS

| 4,453,090 | A | | 6/1984 | Sempel | |
|---|---|---|---|---|---|
| 5,008,799 | A | | 4/1991 | Montalvo | |
| 5,544,102 | A | * | 8/1996 | Tobita et al. | 365/189.09 |
| 5,926,064 | A | * | 7/1999 | Hariton | 327/581 |
| 5,982,247 | A | | 11/1999 | Yoshizawa et al. | |
| 6,303,957 | B1 | * | 10/2001 | Ohwa | 257/307 |
| 6,791,383 | B2 | * | 9/2004 | Chatterjee | 327/156 |

FOREIGN PATENT DOCUMENTS

| JP | 03016260 A | * | 1/1991 |
|---|---|---|---|
| JP | 05-268761 | | 10/1993 |
| JP | 10-256489 | | 9/1998 |

OTHER PUBLICATIONS

Sedra, Adel S., and Kenneth C. Smith, ed. Microelectronic Circuits. 4th ed. New York: Oxford University Press, 1998.*
Metzger, Robert. "CMOS gets ready for high-speed wireless LANs." Compound Semiconductor Sep. 2002. Nov. 17, 2005 <http://www.compoundsemiconductor.net/articles/magazine/8/9/5/1>.*
Sedra, Adel S., and Kenneth C. Smith, ed. Microelectronic Circuits. 4th ed. New York: Oxford University Press, 1998, p. 374.*

* cited by examiner

*Primary Examiner*—Andy Huynh
*Assistant Examiner*—Earl N. Taylor
(74) *Attorney, Agent, or Firm*—Arent Fox LLP

(57) ABSTRACT

A semiconductor device in which a dielectric breakdown of a gate oxide in a MOS capacitor can be prevented and in which a circuit area can be reduced. The semiconductor device comprises an NMOS transistor a gate of which is connected to a terminal VDD on a high potential side and a PMOS transistor a gate of which is connected to a terminal GND on a low potential side, source/drain (S/D) regions of the NMOS transistor and source/drain (S/D) regions of the PMOS transistor being electrically connected.

2 Claims, 4 Drawing Sheets

MOS CAPACITOR DEVICE

CROSS-REFERENCE TO RELATED APPLICATIONS

This application is based upon and claims the benefits of priority from the prior Japanese Patent Application No. 2004-178532, filed on Jun. 16, 2004, the entire contents of which are incorporated herein by reference.

BACKGROUND OF THE INVENTION (1) Field of the Invention

This invention relates to a semiconductor device and, more particularly, to a semiconductor device having MOS transistors each of which functions as a capacitor.

(2) Description of the Related Art

To decrease noise which appears on power supply lines in semiconductor devices, such as large scale integrated circuits (LSIs), there are cases where a metal oxide semiconductor (MOS) transistor to be used as a capacitor (MOS capacitor) is connected between a power supply terminal and GND as a bypass capacitor.

FIGS. 3A and 3B are circuit diagrams of a conventional semiconductor device using a single MOS capacitor between a power supply terminal and GND. FIG. 3A is a circuit diagram of a conventional semiconductor device using an n-channel MOS transistor as the single MOS capacitor. FIG. 3B is a circuit diagram of a conventional semiconductor device using a p-channel MOS transistor as the single MOS capacitor.

In FIG. 3A, to make an n-channel MOS transistor (NMOS transistor) 50 function as a MOS capacitor, a gate (G) of the NMOS transistor 50 is connected to a power supply terminal VDD and source/drain (S/D) regions of the NMOS transistor 50 are connected to GND.

In FIG. 3B, to make a p-channel MOS transistor (PMOS transistor) 51 function as a MOS capacitor, a gate of the PMOS transistor 51 is connected to GND and source/drain (S/D) regions of the PMOS transistor 51 are connected to a power supply terminal VDD.

However, if a single MOS capacitor is used between power supply and GND, voltage between the power supply and GND is applied between the gate and the source/drain regions of the MOS capacitor. This may cause a dielectric breakdown of a gate oxide in the MOS capacitor. Accordingly, there is a problem with its reliability.

To solve this problem, a circuit in which two MOS capacitors are connected in series is disclosed with the aim of decreasing voltage applied between the gate and the source/drain regions of one MOS capacitor (see, for example, Japanese Unexamined Patent Publication No. Hei10-256489).

FIG. 4 is an example of a circuit diagram of a conventional semiconductor device using two MOS capacitors between a power supply terminal and GND.

In this circuit, two MOS capacitors are connected between a power supply terminal VDD and GND. That is to say, this circuit includes an NMOS transistor 52 a gate of which is connected to the power supply terminal VDD and an NMOS transistor 53 a gate of which is connected to source/drain regions of the NMOS transistor 52 and source/drain regions of which is connected to GND. Substrate portions on which the NMOS transistors 52 and 53 are formed are connected to GND.

With this circuit, the two MOS capacitors are connected between the power supply terminal VDD and GND, so voltage applied between the gate and the source/drain regions of one MOS capacitor can be decreased.

SUMMARY OF THE INVENTION

In the present invention, a semiconductor device having MOS transistors each of which functions as a capacitor is provided. This semiconductor device comprises an n-channel MOS transistor a gate of which is connected to a terminal on a high potential side and a p-channel MOS transistor a gate of which is connected to a terminal on a low potential side, source/drain regions of the n-channel MOS transistor and source/drain regions of the p-channel MOS transistor being electrically connected to one another.

The above and other features and advantages of the present invention will become apparent from the following description when taken in conjunction with the accompanying drawings which illustrate preferred embodiments of the present invention by way of example.

DESCRIPTION OF THE PREFERRED EMBODIMENT

Figure 1:
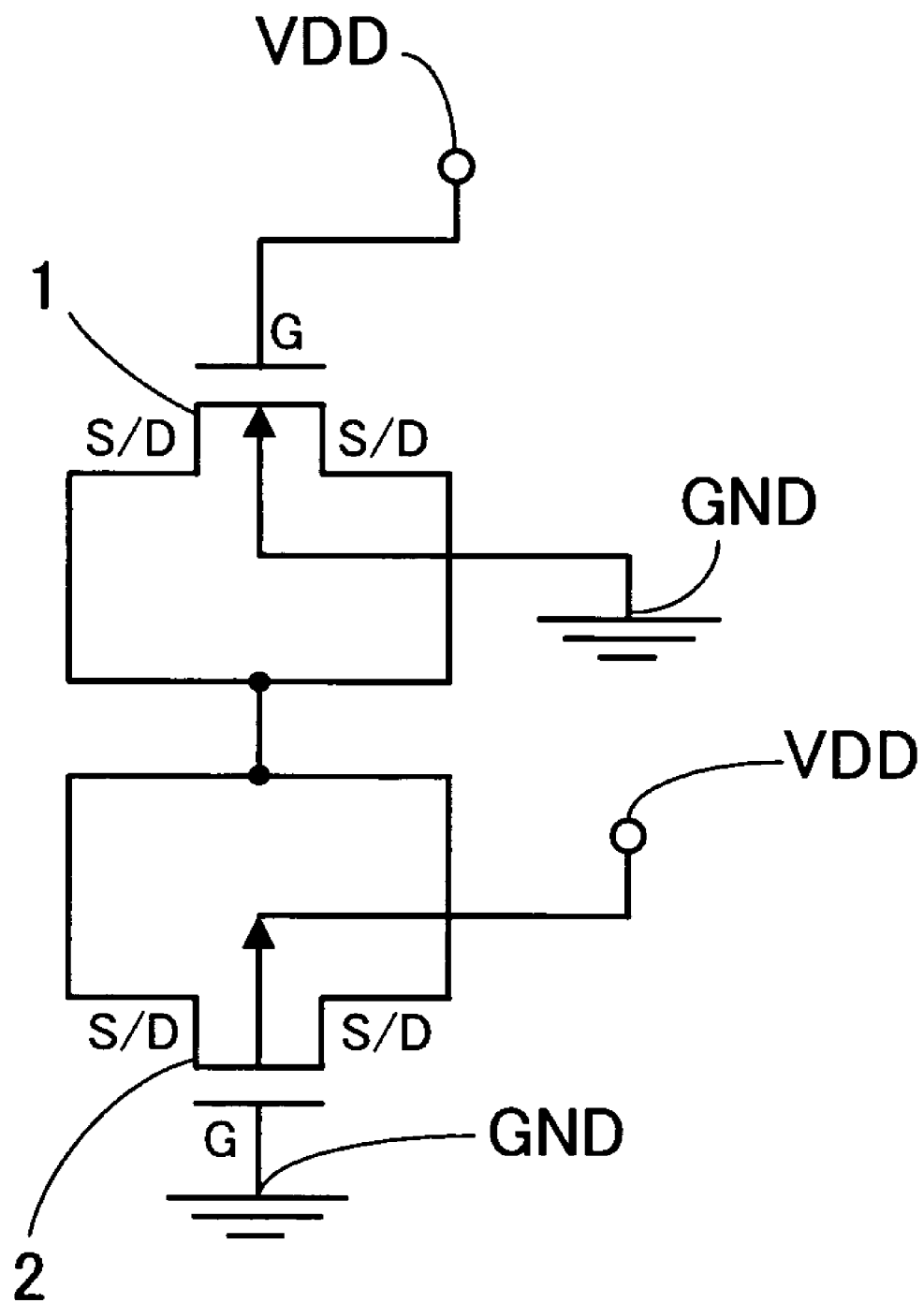
FIG. 1 is a circuit diagram of a semiconductor device according to an embodiment of the present invention.

As described in "Description of the Related Art," with the conventional semiconductor device, the potential (intermediate potential) of an intermediate node N5 between the two MOS capacitors drops to a GND level by parasitic diodes formed at junctions of a (p-type) substrate portion on which the NMOS transistor 52 is formed and the (n-type) source/drain regions of the NMOS transistor 52. As a result, power supply voltage is applied to the NMOS transistor 52. Accordingly, a circuit for determining intermediate potential must be added, resulting in an increase in circuit area.

The present invention was made to solve this problem. An object of the present invention is to provide a semiconductor device in which a dielectric breakdown of a gate oxide in a MOS capacitor can be prevented and in which a circuit area can be reduced.

An embodiment of the present invention will now be described in detail with reference to the drawing.

FIG. 1 is a circuit diagram of a semiconductor device according to an embodiment of the present invention.

In a semiconductor device according to an embodiment of the present invention, an NMOS transistor 1 and a PMOS transistor 2 each of which functions as a MOS capacitor are connected between a terminal on a high potential side (power supply terminal VDD) and a terminal on a low potential side (GND).

A gate (G) of the NMOS transistor 1 is connected to the power supply terminal VDD and a voltage of, for example, 5 volts is applied to the gate of the NMOS transistor 1. Source/drain (S/D) regions of the NMOS transistor 1 are electrically connected to source/drain (S/D) regions of the PMOS transistor 2. A substrate portion on which the NMOS transistor 1 is formed is connected to GND.

On the other hand, a gate (G) of the PMOS transistor 2 is connected to GND and is at, for example, 0 volt. The source/drain (S/D) regions of the PMOS transistor 2 are electrically connected to the source/drain (S/D) regions of the NMOS transistor 1. A substrate portion on which the PMOS transistor 2 is formed is connected to the power supply terminal VDD.

Figure 2:
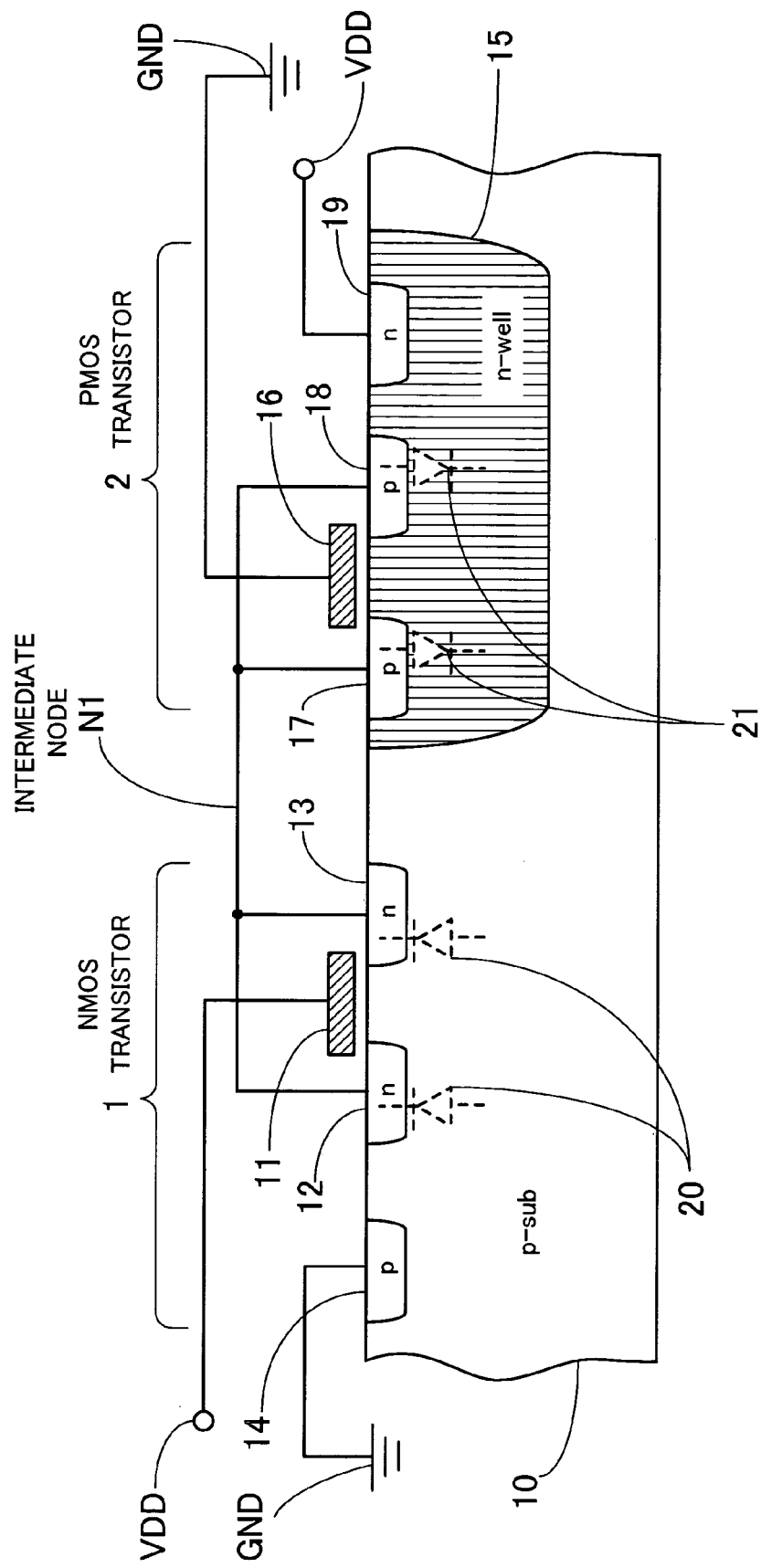
FIG. 2 is a sectional view of the semiconductor device according to the embodiment of the present invention.
Figure 3A:
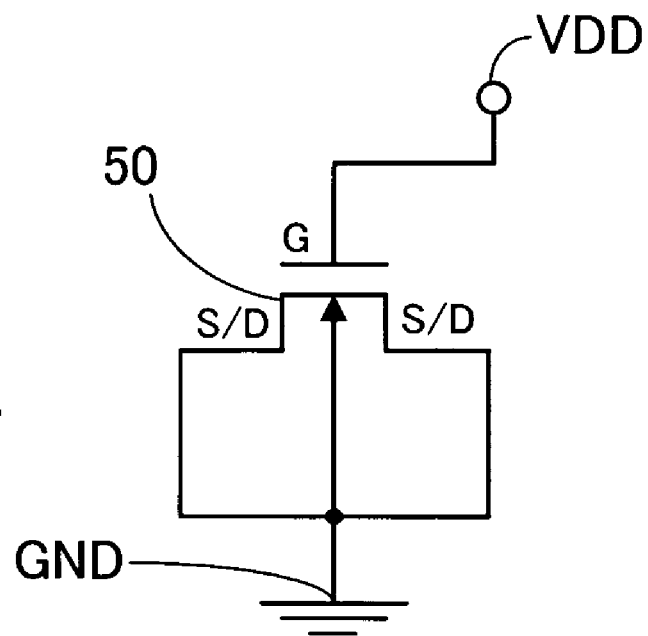
FIGS. 3A and 3B are circuit diagrams of a conventional semiconductor device using a single MOS capacitor between a power supply terminal and GND, FIG. 3A being a circuit diagram of a conventional semiconductor device using an n-channel MOS transistor as the single MOS capacitor, FIG. 3B being a circuit diagram of a conventional semiconductor device using a p-channel MOS transistor as the single MOS capacitor.
Figure 3B:
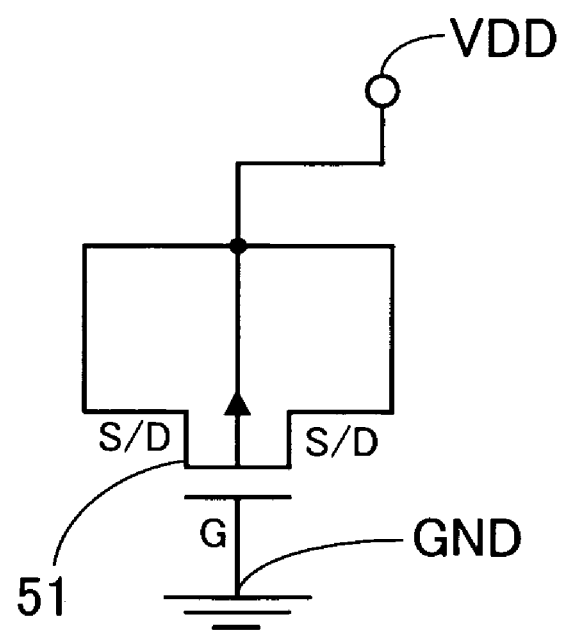
Figure 4:
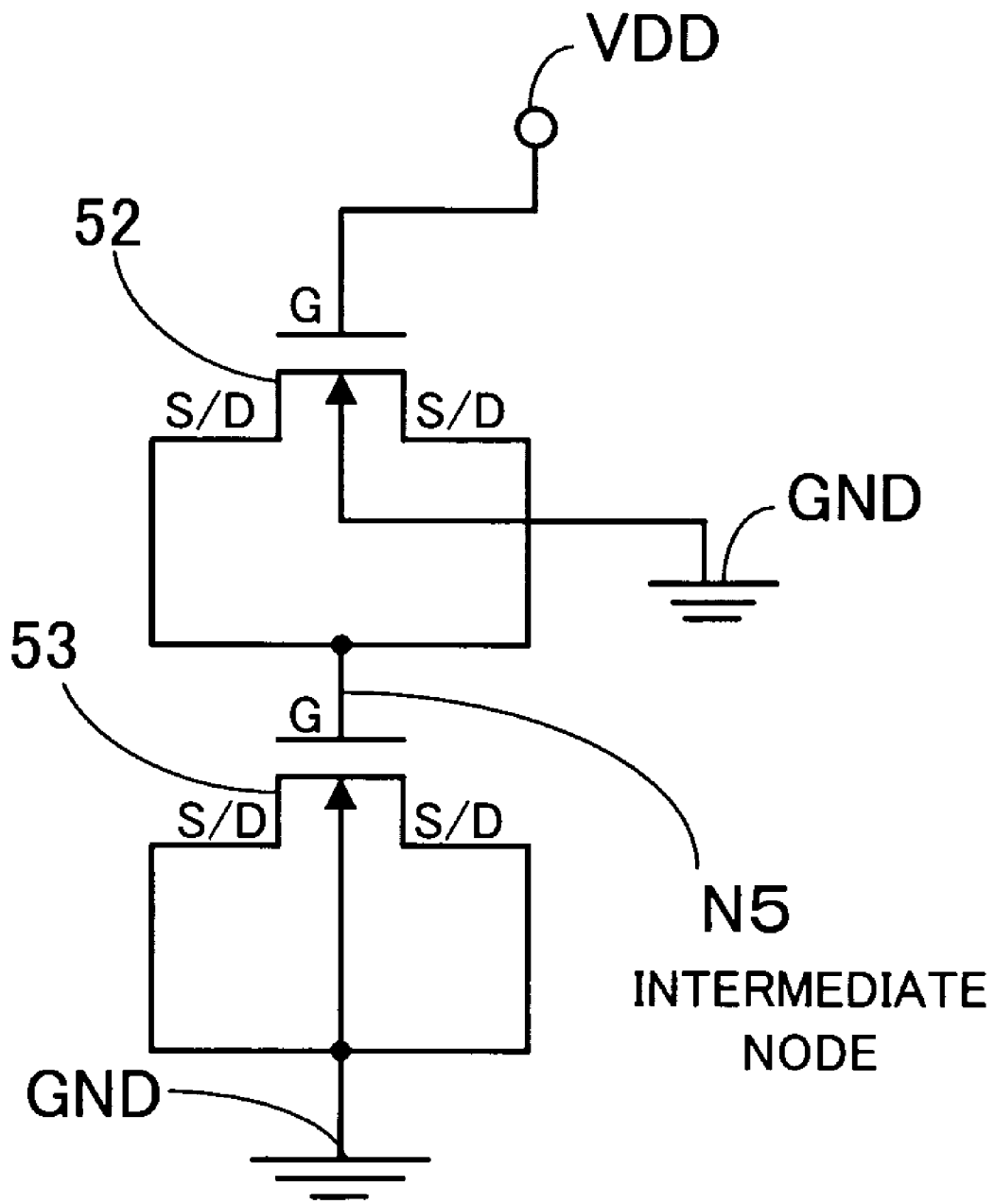
FIG. 4 is an example of a circuit diagram of a conventional semiconductor device using two MOS capacitors between a power supply terminal and GND.

FIG. 2 is a sectional view of the semiconductor device according to the embodiment of the present invention.

As shown in FIG. 2, in the semiconductor device according to the embodiment of the present invention, the NMOS transistor 1 and the PMOS transistor 2 are formed on a p-type substrate 10. The NMOS transistor 1 includes a gate electrode 11, n-type source/drain regions 12 and 13, and a p-type impurity implanted layer 14 for connecting the substrate portion on which the NMOS transistor 1 is formed to GND which determines the potential of the substrate portion on which the NMOS transistor 1 is formed. On the other hand, the PMOS transistor 2 is formed on an n well 15 and includes a gate electrode 16, p-type source/drain regions 17 and 18, and an n-type impurity implanted layer 19 for connecting the substrate portion (n well 15) on which the PMOS transistor 2 is formed to the power supply terminal VDD which determines the potential of the substrate portion (n well 15) on which the PMOS transistor 2 is formed. Gate oxides and the like are not shown in FIG. 2.

In the semiconductor device having the above structure, parasitic diodes 20 are formed between the n-type source/drain region 12 of the NMOS transistor 1 and the p-type substrate 10 and between the n-type source/drain region 13 of the NMOS transistor 1 and the p-type substrate 10. Similarly, parasitic diodes 21 are formed between the p-type source/drain region 17 of the PMOS transistor 2 and the n well 15 and between the p-type source/drain region 18 of the PMOS transistor 2 and the n well 15. In the present invention, the source/drain regions 12 and 13 of the NMOS transistor 1 and the source/drain regions 17 and 18 of the PMOS transistor 2 are electrically connected, so the parasitic diodes 20 and 21 are electrically connected. That is to say, a direct current path from the power supply terminal VDD, through the parasitic diodes 21 formed between the p-type source/drain region 17 of the PMOS transistor 2 and the n well 15 and between the p-type source/drain region 18 of the PMOS transistor 2 and the n well 15 and the parasitic diodes 20 formed between the n-type source/drain region 12 of the NMOS transistor 1 and the p-type substrate 10 and between the n-type source/drain region 13 of the NMOS transistor 1 and the p-type substrate 10, to GND will be made.

As a result, the potential (intermediate potential) of an intermediate node N1 between two MOS capacitors as which the NMOS transistor 1 and the PMOS transistor 2 function is determined by the parasitic diodes 20 and 21 and its value is usually equal to half of the voltage of the power supply terminal VDD. For example, if the voltage of the power supply terminal VDD is 5 volts, then a voltage of 2.5 volts is applied to one MOS capacitor. That is to say, the value of voltage applied to one MOS capacitor becomes smaller. Therefore, a dielectric breakdown of a gate oxide can be prevented and a semiconductor device with higher reliability can be provided.

Moreover, the intermediate potential is determined by the parasitic diodes 20 and 21, so there is no need to use an additional circuit for determining the intermediate potential. Accordingly, a circuit area does not increase and a semiconductor device can be made minuter.

In the above embodiment, the gate of the NMOS transistor 1 and the substrate portion (n well 15) on which the PMOS transistor 2 is formed are connected to the power supply terminal VDD and the gate of the PMOS transistor 2 and the substrate (p-type substrate 10) portion on which the NMOS transistor 1 is formed are connected to GND. However, another connection method may be used if voltage at which the NMOS transistor 1 and the PMOS transistor 2 turn on can be supplied.

The present invention is applied to, for example, a bypass capacitor connected between a power supply and GND for decreasing noise that appears on a power supply line in an LSI.

With the semiconductor device according to the present invention, intermediate potential between the NMOS transistor and the PMOS transistor which function as capacitors is determined by the parasitic diodes formed between the source/drain regions of the NMOS transistor and the substrate and the parasitic diodes formed between the source/drain regions of the PMOS transistor and the substrate. Usually the value of this intermediate potential is equal to half of power supply voltage applied to the substrate portion on which the PMOS transistor is formed. This decreases voltage applied to one MOS transistor and a dielectric breakdown of a gate oxide in it can be prevented.

In addition, with the semiconductor device according to the present invention, this intermediate potential is determined by the parasitic diodes, so there is no need to use an additional circuit for determining the intermediate potential.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device having MOS transistors which function as capacitors, the device comprising:
   an n-channel MOS transistor a gate of which is connected to a terminal on a high potential side wherein a first MOS capacitor is formed; and
   a p-channel MOS transistor a gate of which is connected to a terminal on a low potential side wherein a second MOS capacitor is formed, wherein
   the first and second MOS capacitors are connected in series,
   source/drain regions of the n-channel MOS transistor and source/drain regions of the p-channel MOS transistor are electrically connected,
   parasitic diodes formed between the source/drain regions of the n-channel MOS transistor and a substrate region thereof and parasitic diodes formed between the source/drain regions of the p-channel MOS transistor and a substrate region thereof are electrically connected,
   the substrate region of the n-channel MOS transistor is connected to a terminal on the low potential side, and the substrate region of the p-channel MOS transistor is connected to a terminal on the high potential side, and
   a direct current path from a high-potential-side terminal through the parasitic diodes of the n-channel MOS transistor and the parasitic diodes of the p-channel MOS transistor to a low-potential-side terminal is formed.

2. The semiconductor device according to claim 1, wherein an intermediate potential between the MOS capacitors is a potential between the parasitic diodes formed in the n-channel MOS transistor and the parasitic diodes formed in the p-channel MOS transistor which are electrically connected.

* * * * *